United States Patent

Beguin et al.

[11] Patent Number: 5,919,383
[45] Date of Patent: Jul. 6, 1999

[54] PACKAGE FOR A TEMPERATURE-SENSITIVE OPTICAL COMPONENT WITH INNER AND OUTER CONTAINERS AND RESISTIVE ELEMENT THEREIN

[75] Inventors: Alain Marcel Jean Beguin, Vulaines Sur Seine; Felice Scotta, Savigny Le Temple, both of France

[73] Assignee: Corning Incorporated, Corning, N.Y.

[21] Appl. No.: 08/984,799

[22] Filed: Dec. 4, 1997

[51] Int. Cl.[6] .................................................. H05B 3/00
[52] U.S. Cl. ................................... 219/209; 219/385
[58] Field of Search .................................... 219/209, 210, 219/544, 385, 520; 331/69; 359/512

[56] References Cited

U.S. PATENT DOCUMENTS

| | | | |
|---|---|---|---|
| 3,028,473 | 4/1962 | Dyer et al. | 219/210 |
| 3,237,173 | 2/1966 | Chamberlain et al. | 219/209 |
| 3,662,150 | 5/1972 | Hartung | 219/209 |
| 3,838,248 | 9/1974 | Uchida et al. | 219/210 |
| 3,883,715 | 5/1975 | Gebo | 219/210 |
| 3,962,559 | 6/1976 | Drda et al. | 219/210 |
| 4,216,371 | 8/1980 | Marotel | 219/210 |
| 5,530,408 | 6/1996 | Vig et al. | 331/69 |
| 5,729,181 | 3/1998 | Cutler et al. | 331/69 |

FOREIGN PATENT DOCUMENTS

| | | |
|---|---|---|
| 46-18422 | 5/1971 | Japan . |
| 94/11763 | 5/1994 | WIPO . |

*Primary Examiner*—John A. Jeffery
*Attorney, Agent, or Firm*—Edward F. Murphy

[57] ABSTRACT

A package for a temperature sensitive optical component (20) includes inner (14) and outer (12) containers of low thermal conductivity plastics material, a foam insulation (18) being situated between the two containers. Within the inner container (14) are a thermally conductive plate to which the component (20), a temperature sensitive resistor, and a resistive heating element are affixed. A temperature compensating circuit (16) is located outside the inner container. The temperature sensitive resistor is part of a Wheatstone bridge at the input of the circuit (16), whereby the circuit compensates for variations in operating voltage. The output transistor of the circuit regulates the current through the resistive heating element in response to variations in the resistance of the temperature sensitive resistor. This transistor extends into the inner container (14) and is in contact with the thermally conductive plate, whereby heat from the transistor is dissipated into the plate. This maintains the temperature of the transistor substantially constant.

29 Claims, 3 Drawing Sheets

PACKAGE FOR A TEMPERATURE-SENSITIVE OPTICAL COMPONENT WITH INNER AND OUTER CONTAINERS AND RESISTIVE ELEMENT THEREIN

The present invention relates to a package for a temperature sensitive component, and more particularly, to a package that will maintain the component at a substantially constant temperature when the package is subjected to a large range of outside temperatures.

BACKGROUND OF THE INVENTION

The optical characteristics of certain optical components are temperature dependent. A typical example of such a component is a planar WDM component based on a phase array design (a design based on optical interferences between a large number of waveguides with different optical paths). Such components are usually packaged with a temperature regulation system utilizing a Peltier element. Reference may be made to H. Uetsuka et al. "Novel 1×N Guided-Wave Multi/demultiplexer for FDM", OFC'95 Technical Digest, pages 76, 77. However, this type of temperature compensation system has several disadvantages. It is expensive, it consumes relatively large amounts of power, and it requires a thermal exchange with the outside world. Moreover, it requires a dedicated power supply with AC input power at 110 V or 220 V.

BRIEF SUMMARY OF THE INVENTION

It is therefore an object of the invention to provide a temperature compensation system that will overcome the heretofore noted disadvantages of prior art systems. Another object is to provide a component package that will maintain the component at a substantially constant temperature when the package is subjected to a large range of outside temperatures (typically 0° C. to 70° C.). A further object is to provide a temperature compensating component package that is simple in design, reliable, compact and inexpensive to manufacture. Another object is to provide a component package that has self-contained thermal regulation with low power consumption and which uses a standard electronic power supply (+5V/0V or +5V/-5V, for example).

Briefly, the present invention relates to a package for a temperature sensitive component, the package including outer and inner containers. The temperature sensitive component is disposed within the inner container. A circuit is disposed in the outer container outside the inner container. A temperature sensor that is in thermal contact with the component provides an input to the circuit. The circuit controls the energization of a heating element that is in thermal contact with the component.

In one embodiment the inner and outer containers are formed of thermally insulating material and insulation is disposed between the inner and outer containers. The circuit includes a transistor for regulating the current flowing through the heating element.

Within the inner container is a thermally conductive plate with which the component, the heating element, the temperature sensor and the transistor are in contact. The circuit includes a plurality of resistors arranged in a Wheatstone bridge configuration. The temperature sensor is one of the plurality of resistors, whereby the circuit compensates for variations in voltage applied to the Wheatstone bridge.

Further features and advantage of the present invention will become apparent from the following description of preferred embodiments thereof, given by way of example, and illustrated in the accompanying drawings.

DETAILED DESCRIPTION OF THE INVENTION

Figure 1:
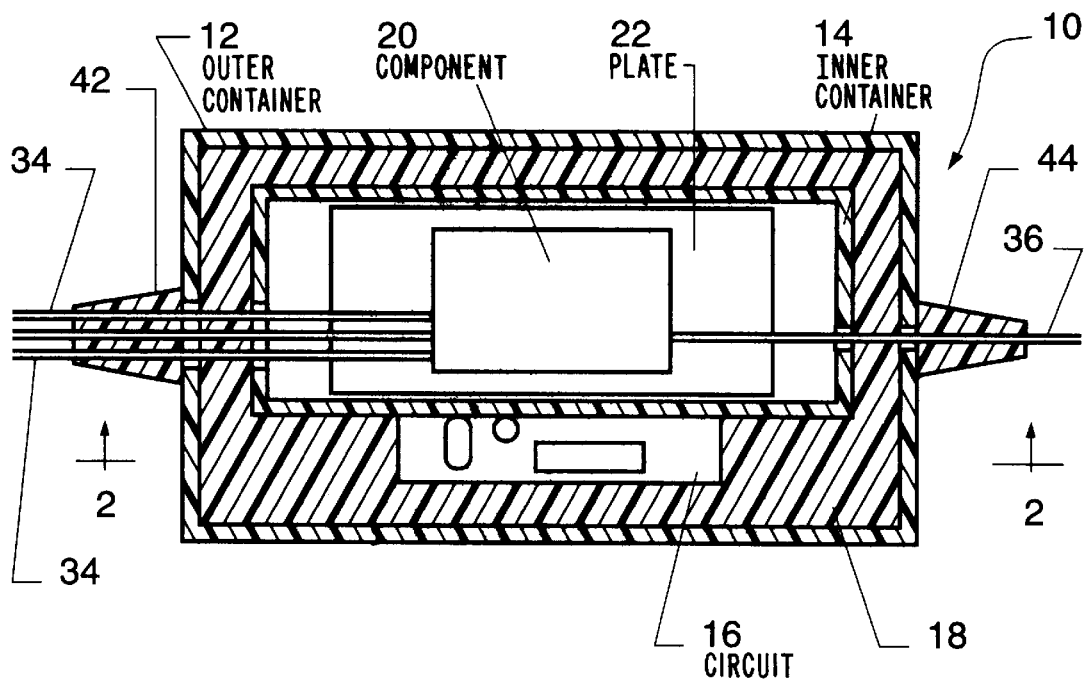
FIG. 1 is a cross-sectional view of an embodiment of optical component package according to the present invention.
Figure 3:
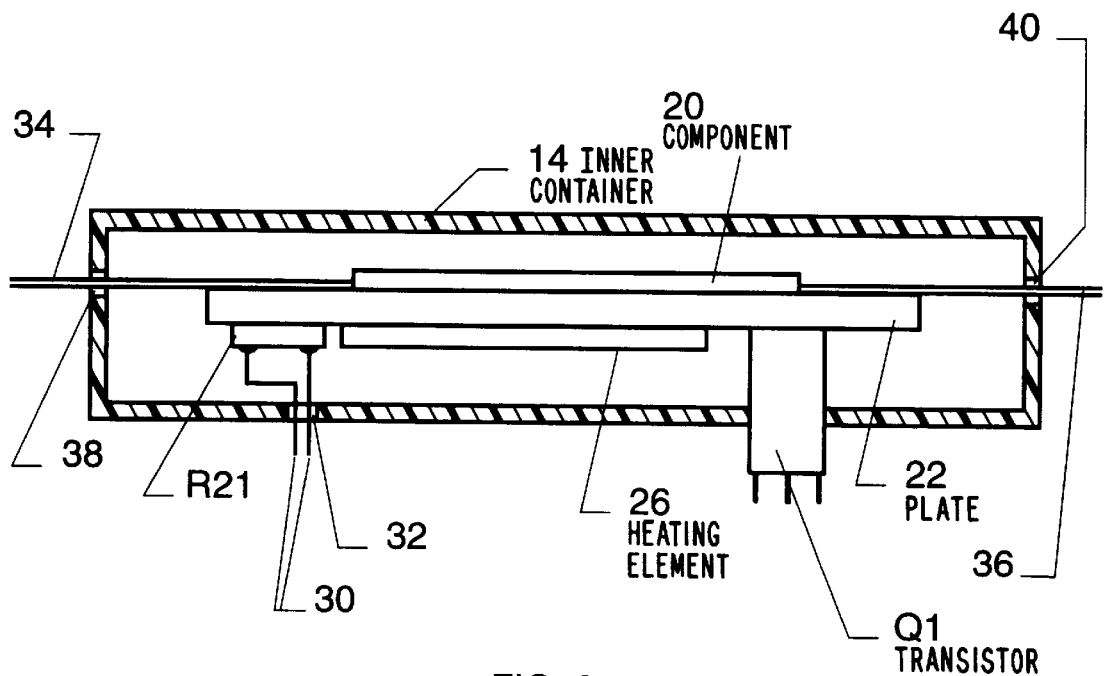
FIG. 3 is a cross-sectional view of the inner container of FIGS. 1 and 2.

In accordance with the preferred embodiment of the present invention illustrated in FIGS. 1 and 3, a temperature compensation package 10 is composed of three main parts: (a) an outer container 12 with optical and electrical inputs and outputs, (b) an inner container 14 in which the optical component 20 is placed, and (c) an electronic temperature regulation circuit 16.

The outer and inner containers 12 and 14 are preferably made of a low thermal conductivity polymer. An insulating foam 18 or the like is located between the outer and inner containers. The polymer outer container thermally isolates the inside of this container from the outside world. The polymer inner container, along with the foam insulation, thermally isolates the inner container such that there are no thermal paths between this container and the outer container. As a consequence of use of such inner and outer containers and the foam insulation, power consumption is limited to below 3 watts when the component is maintained at 75° C. constant temperature and the temperature compensation package 10 is operating in the temperature range between 0° C. and 70° C.

Optical fibers 34 and 36 extend from the ends of component 20 and through holes 38 and 40, respectively, in inner container 14. Fiber 34 also extends through strain relief boot 42 that is affixed to one end of outer container 12, and fiber 36 also extends through a strain relief boot 44 that is affixed to the other end of outer container 12.

Figure 4:
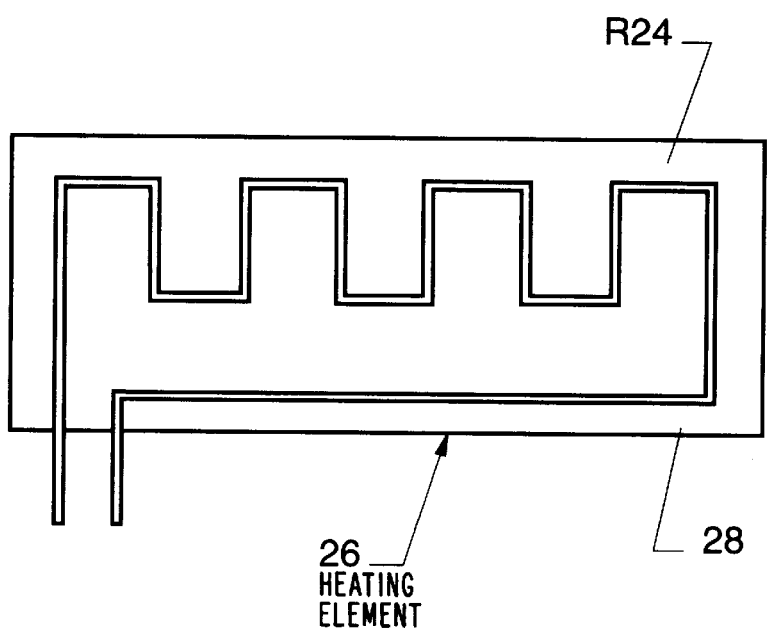
FIG. 4 shows the construction of a resistive heating element which may be used in the package of FIGS. 1 and 3.

Within the inner container 14 is a thermally conductive plate 22, on which optical component 20 is located. A suitable material for plate 22 is aluminum. Clearly, other materials could be used instead. A resistive heating element 26 is fixed to the opposite side of plate 22 than component 20. As shown in FIG. 4, heating element 26 may consist of a path R24 of resistance heating material disposed between two polyimid sheets 28 (only one of the sheets 28 is shown). One or more temperature sensing resistors R21 can be fixed to thermally conducting plate 22 or to that side of component 20 opposite plate 22. If two sensing resistors R21 are employed, one can be situated at each end of plate 22. Resistor R21 is preferably formed of platinum. Leads 30 extend from resistor R21 through hole 32 in the bottom of container 12 to a temperature compensation circuit (to be described below).

The temperature compensation circuit 16 is located within outer container 12 close to inner container 14. Circuit 16 regulates the temperature of component 20 using the information provided by temperature sensor R21. External connection is made to circuit 16 via pins 48 that extend through a hole in outer container 12.

Figure 2:
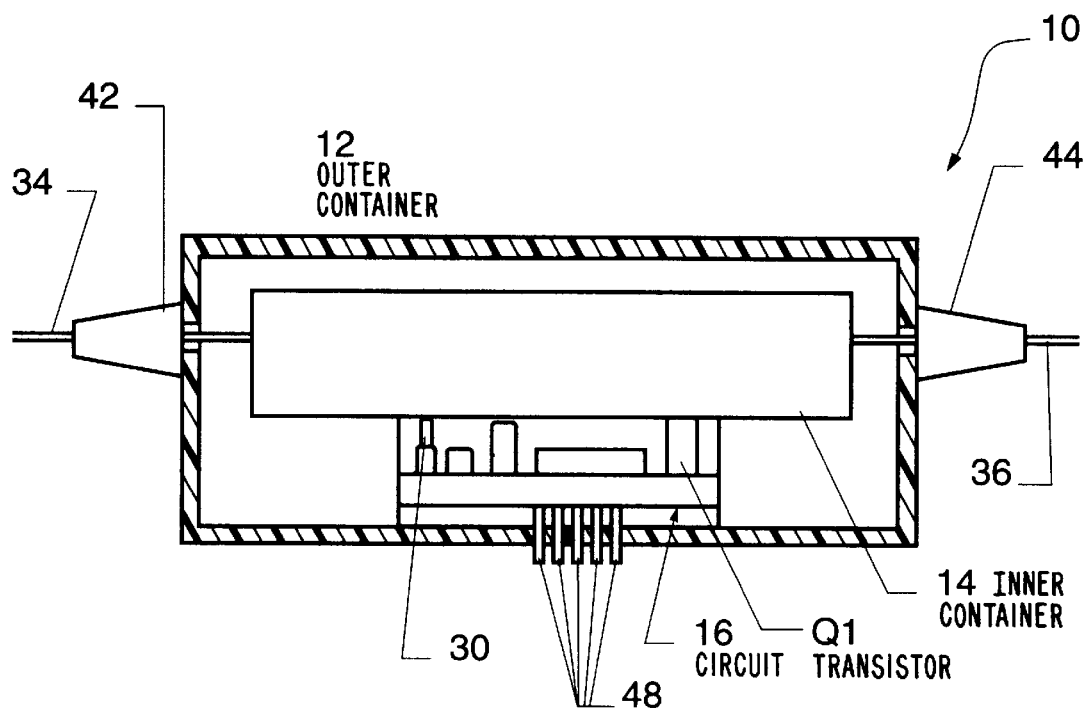
FIG. 2 is a cross-sectional view taken along lines 2—2 of FIG. 1, insulation having been removed to reveal an internal container.
Figure 5:
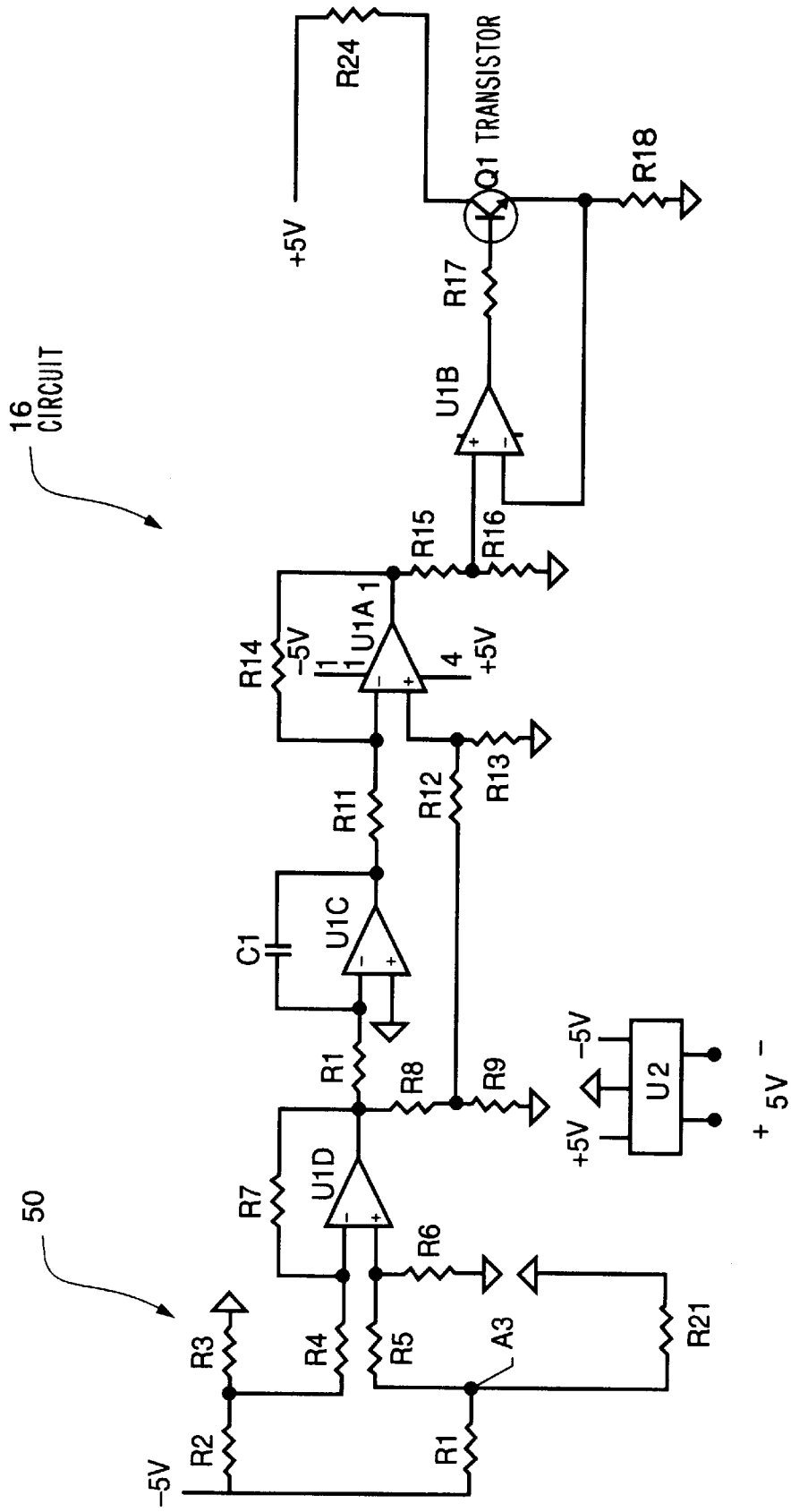
FIG. 5 is a schematic diagram of a temperature regulation circuit.

FIG. 5 shows a circuit which may be used as the temperature compensation circuit 16 in the package of FIGS. 1 to 3. Voltage converter U2 converts a 0/5 volt source to +5 volts/−5 volts. If the external voltage source provides the proper voltage, converter U2 is not needed, and the operating voltage is supplied to the various pins 48. Sensing resistor R21 is part of Wheatstone bridge 50, which includes resistors R1, R2 and R3. The voltage generated at Wheatstone bridge 50 is applied to an amplification stage U1D. That value of resistor R3 which results in the desired operating temperature of optical component 20 can be determined, and a resistor having that value can be soldered into the circuit. The use of such a fixed resistor increases the stability and reliability of temperature regulation. However, if adjustment is required (to compensate for laser wavelength fluctuations, for example) resistor R3 can be a potentiometer.

The output from stage U1D is connected to a regulation calculation circuit comprising devices U1C and U1A. The output of U1A, taken at the junction of resistors R15 and R16, is coupled by current amplifier U1B to an output transistor Q1. Transistor Q1 regulates the current flow through a heating resistance R24.

If the outside temperature drops, the temperature inside the inner container 14 also drops. The resistance of resistor R21 decreases, thereby causing the voltage at terminal A3 to become less negative. This voltage is amplified by stage U1D, processed by stages U1C and U1A, and amplified by stage U1B, which causes transistor Q1 to increase the flow of current to resistor R24 of heating element 26.

The disclosed temperature compensation circuit possesses several advantages. The temperature of the circuit is between the outside temperature and the temperature of the optical component. This temperature varies according to the outside temperature. As a consequence, there could be a drift of the thermal regulation if the electronic circuit were not designed to be insensitive to its own temperature. An obvious precaution to take is to employ temperature stable components. All the components are preferably guaranteed for an 85° C. operating temperature. In a constructed circuit, all of the input resistors (R1 through R7 of FIG. 5) had low resistance variations with temperature (1% range). The remaining resistors (R8 through R18) are in the 5% range.

Moreover, one of the electronic components whose operation varies with temperature is U2, the 0/5 V to +5 V/−5 V converter. In the Wheatstone bridge portion of the circuit of FIG. 5, the −5 V voltage is applied symmetrically to platinum sensing resistor R21 and resistor R3. The circuit therefore compensates for variations in the voltage of converter U2.

In order to have a very compact and simple design, a ballast transistor Q1 is used for regulation of current flow through the heating element 26. This transistor uses a part of the total consumed power, which should be kept to a minimum. Moreover, in order to have a high reliability system, the temperature of this transistor must be kept below 85° C. As the electronics portion of the package is located in a thermally isolated environment, a temperature as high as 140° C. could be reached by this transistor. In order to provide a reliable, efficient system, component package 10 is constructed such that ballast transistor Q1 extends into the inner container 14 and is affixed to thermally conductive plate 22 (see FIG. 3). Heat from transistor Q1 is dissipated into plate 22, whereby the temperature of the transistor is maintained at the same constant temperature at which the component 20 is maintained. Thus, the reliability of transistor Q1 is increased. Moreover, power dissipated by transistor Q1 is used to heat the component, thus minimizing the consumption of power.

A typical circuit constructed in accordance with the above description can include the following components. Capacitor C1 is a 25 volt, 22 mF capacitor. Resistor R24 is a 5.3 ohm, 20 watt film resistor. The resistance of R21 is 100 ohms at 0° C. The remaining resistors have values as listed in Table 1.

TABLE 1

| Resistor | Resistance (ohms) |
|---|---|
| R1 | $1.5 \times 10^3$ |
| R2 | $1.5 \times 10^3$ |
| R3 | 129.1 |
| R4 | $10 \times 10^3$ |
| R5 | $10 \times 10^3$ |
| R6 | $150 \times 10^3$ |
| R7 | $150 \times 10^3$ |
| R8 | $10 \times 10^3$ |
| R9 | $10 \times 10^3$ |
| R10 | $220 \times 10^3$ |
| R11 | $100 \times 10^3$ |
| R12 | $100 \times 10^3$ |
| R13 | $100 \times 10^3$ |
| R14 | $100 \times 10^3$ |
| R15 | $8.2 \times 10^3$ |
| R16 | $1.2 \times 10^3$ |
| R17 | 47 |
| R18 | 0.22 |

It is to be understood that numerous changes may be made to the preferred embodiment described above without departing from the present invention. Thus, for example, the insulating material provided between the inner and outer containers need not be an insulating foam; other heat insulating material may be used. Similarly, for example, the thermally conductive plate 22 need not be made of aluminum; other thermally conductive materials may be used. Further, the above-listed ohmic values of the resistors included in the FIG. 5 circuit are merely examples of suitable values. Moreover the detailed circuit arrangement of FIG. 5 may be modified as appropriate, for example, by altering the number of amplification stages.

What is claimed:

1. A package for a temperature sensitive component, characterized in that it comprises:

an outer container, an inner container located within said outer container, a temperature sensitive component disposed within said inner container, a circuit in said outer container outside said inner container, a temperature sensor in thermal contact with said component, said sensor providing an input signal to said circuit, a heating element in thermal contact with said component, said circuit controlling said energization of said heating element, said circuit includes a transistor for regulating the current flowing through said heating element, said transistor extending into said inner container, a thermally conductive plate located in said inner container, said component, said heating element and said temperature sensor disposed on said plate and said transistor in contact with said plate.

2. The package of claim 1, characterized in that said inner and outer containers are formed of a thermally insulating material.

3. The package of claim 2, characterized in that said thermally insulating material is a low thermal conductivity polymer.

4. The package of claim 1 characterized in that said package further comprises a thermal insulation disposed between said inner and said outer container.

5. The package of claim 4, characterized in that said thermal insulation is a foam insulation.

6. The package of claim 1 wherein said temperature sensitive component comprises an optical component.

7. The package of claim 6 wherein the package maintains the component at a substantially constant temperature when the package is subjected to an outside temperature range of 0° to 70° C.

8. The package of claim 6, characterized in that said circuit includes a plurality of resistors arranged in a Wheatstone bridge configuration, said temperature sensor being one of said plurality of resistors, and means for applying a voltage to said Wheatstone bridge resistor configuration.

9. The package of claim 8, characterized in that there is further provided means for processing the voltage appearing on said Wheatstone bridge and for providing a control signal, and current control means responsive to said control signal for regulating the current flowing through said heating element, said current control means extending into said inner container.

10. The package of claim 8, characterized in that said means for applying a voltage comprises a voltage converter and said Wheatstone bride configuration compensates for variations in the output voltage of said converter.

11. The package of claim 1 wherein said temperature sensitive component comprises a planar optical WDM.

12. The package of claim 1 wherein said temperature sensitive component comprises an optical waveguide phase array.

13. A packaged temperature sensitive optical component device, characterized in that it comprises:
    an outer container,
    an inner container located within said outer container,
    a temperature sensitive optical component disposed within said inner container,
    a circuit in said outer container,
    a temperature sensor in thermal contact with said optical component, said sensor providing an input signal to said circuit,
a heating element in thermal contact with said optical component, said circuit controlling said energization of said heating element, said circuit includes a transistor for regulating the current flowing through said heating element, a thermally conductive plate located in said inner container, said optical component, said heating element, said temperature sensor and said transistor in thermal contact with said thermally conductive plate.

14. The device of claim 13, characterized in that said inner and outer containers are formed of a thermally insulating material.

15. The device of claim 14, characterized in that said thermally insulating material is a low thermal conductivity polymer.

16. The device of claim 13 characterized in that said package farther comprises a thermal insulation disposed between said inner and said outer container.

17. The device of claim 16, characterized in that said thermal insulation is a foam insulation.

18. The device of claim 13 wherein said temperature sensitive optical component comprises an optical waveguide.

19. The device of claim 13 wherein said temperature sensitive optical component comprises a planar WDM.

20. The device of claim 13 wherein said temperature sensitive optical component comprises an optical waveguide phase array.

21. The device of claim 13 wherein said temperature sensitive optical component comprises a plurality of optical waveguides with different optical paths.

22. The device of claim 13 wherein the package maintains the optical component at a substantially constant temperature when the package is subjected to an outside temperature range of 0° to 70° C.

23. The package of claim 22, characterized in that there is further provided means for processing the voltage appearing on said Wheatstone bridge and for providing a control signal, and current control means responsive to said control signal for regulating the current flowing through said heating element, said current control means extending into said inner container.

24. The package of claim 22, characterized in that said means for applying a voltage comprises a voltage converter and said Wheatstone bridge configuration compensates for variations in the output voltage of said converter.

25. The package of claim 13, characterized in that said circuit includes a plurality of resistors arranged in a Wheatstone bridge configuration, said temperature sensor being one of said plurality of resistors, and means for applying a voltage to said Wheatstone bridge resistor configuration.

26. A package for a temperature sensitive optical planar WDM waveguide component, characterized in that it comprises:
    an outer container,
    an inner container located within said outer container,
    a temperature sensitive optical planar WDM waveguide component disposed within said inner container,
    a circuit in said outer container,
    a temperature sensor in thermal contact with said optical component, said sensor providing an input signal to said circuit,
a heating element in thermal contact with said optical component, said circuit controlling said energization of said heating element, said circuit includes a transistor for regulating the current flowing through said heating element, a thermally conductive plate located in said inner container, said optical component, said heating element, said temperature sensor and said transistor in thermal contact with said thermally conductive plate.

27. The device of claim 26, characterized in that said optical planar WDM waveguide component is comprised of a phase array of optical waveguides.

28. The device of claim 27 wherein the package maintains the optical planar WDM waveguide component at a substantially constant temperature when the package is subjected to an outside temperature range of 0° to 70° C.

29. The device of claim 26 wherein the package maintains the optical planar WDM waveguide component at a substantially constant temperature when the package is subjected to an outside temperature range of 0° to 70° C.

* * * * *